(12) United States Patent
Lin et al.

(10) Patent No.: US 10,573,638 B2
(45) Date of Patent: Feb. 25, 2020

(54) ESD PROTECTION CIRCUIT ASSEMBLY FOR CMOS MANUFACTURING PROCESS

(71) Applicant: eGalax_eMPIA Technology Inc., Taipei (TW)

(72) Inventors: Po-Chuan Lin, Taipei (TW); Shr-Hau Shiue, Taipei (TW)

(73) Assignee: EGALAX_EMPIA TECHNOLOGY INC., Taipei (TW)

( * ) Notice: Subject to any disclaimer, the term of this patent is extended or adjusted under 35 U.S.C. 154(b) by 0 days.

(21) Appl. No.: 15/986,307

(22) Filed: May 22, 2018

(65) Prior Publication Data

US 2019/0206858 A1 Jul. 4, 2019

(30) Foreign Application Priority Data

Dec. 28, 2017 (TW) .............................. 106146287 A

(51) Int. Cl.
*H01L 29/74* (2006.01)
*H01L 27/02* (2006.01)
(Continued)

(52) U.S. Cl.
CPC ........ *H01L 27/0259* (2013.01); *H01L 23/528* (2013.01); *H01L 23/585* (2013.01); *H01L 27/027* (2013.01); *H01L 27/0248* (2013.01); *H01L 27/0255* (2013.01); *H01L 27/0262* (2013.01); *H01L 27/0277* (2013.01); *H01L 27/0292* (2013.01); *H01L 29/0804* (2013.01); *H01L 29/0821* (2013.01); *H01L 29/1004* (2013.01); *H01L 29/1079* (2013.01); *H01L 29/1095* (2013.01); *H02H 9/046* (2013.01); *H01L 29/735* (2013.01)

(58) Field of Classification Search
CPC ............ H01L 27/0277; H01L 29/1079; H01L 29/1004; H01L 23/528; H01L 29/0804; H01L 23/585; H01L 29/1095; H01L 29/0821; H01L 27/0255; H01L 27/0262; H01L 27/0259; H01L 27/0292; H01L 27/0248
See application file for complete search history.

(56) References Cited

U.S. PATENT DOCUMENTS 6,084,272 A * 7/2000 Jung .................... H01L 27/0288
257/355
7,525,779 B2 * 4/2009 Chen .................... H01L 27/0255
361/56

(Continued)

*Primary Examiner* — Shouxiang Hu
(74) *Attorney, Agent, or Firm* — Muncy, Geissler, Olds & Lowe, P.C.

(57) ABSTRACT

An ESD protection circuit assembly for use in a CMOS manufacturing process is disclosed to include an I/O circuit including a power I/O unit and a signal I/O unit, and an electrostatic discharge clamp circuit connected to the power I/O unit and including a P-type substrate, a series of low voltage P-type structures arranged on the P-type substrate, a plurality of low voltage N-type wells formed on the P-type substrate corresponding to the low voltage P-type structures and a first P-type heavily doped area and a second P-type heavily doped area formed in each low voltage N-type well. By using a series of low voltage P-type structures to provide high ESD tolerance, the ESD protection circuit assembly can be more effectively utilized in the same circuit layout area.

4 Claims, 10 Drawing Sheets

(51) Int. Cl.
*H02H 9/04* (2006.01)
*H01L 29/10* (2006.01)
*H01L 23/58* (2006.01)
*H01L 29/08* (2006.01)
*H01L 23/528* (2006.01)
*H01L 29/735* (2006.01)

(56) References Cited

U.S. PATENT DOCUMENTS

| | | | | |
|---|---|---|---|---|
| 2004/0155291 | A1* | 8/2004 | Okushima | H01L 27/0255 257/355 |
| 2005/0269659 | A1* | 12/2005 | Huang | H01L 27/0255 257/487 |
| 2006/0278930 | A1* | 12/2006 | Huang | H01L 27/0259 257/361 |
| 2013/0122677 | A1* | 5/2013 | Esmark | H01L 23/60 438/361 |
| 2014/0291764 | A1* | 10/2014 | Ouyang | H01L 27/0277 257/355 |

* cited by examiner

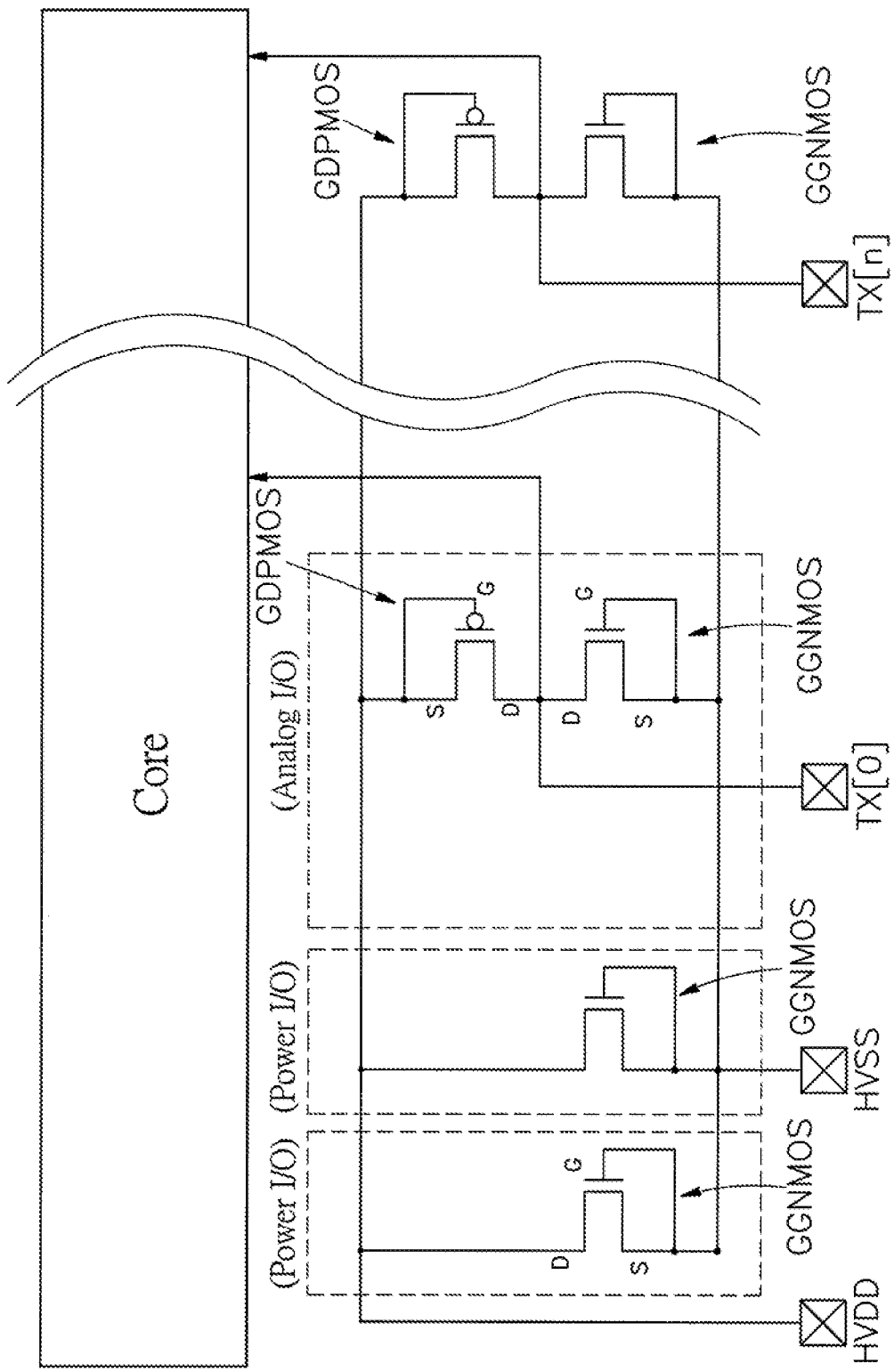
PRIOR ART FIG.5

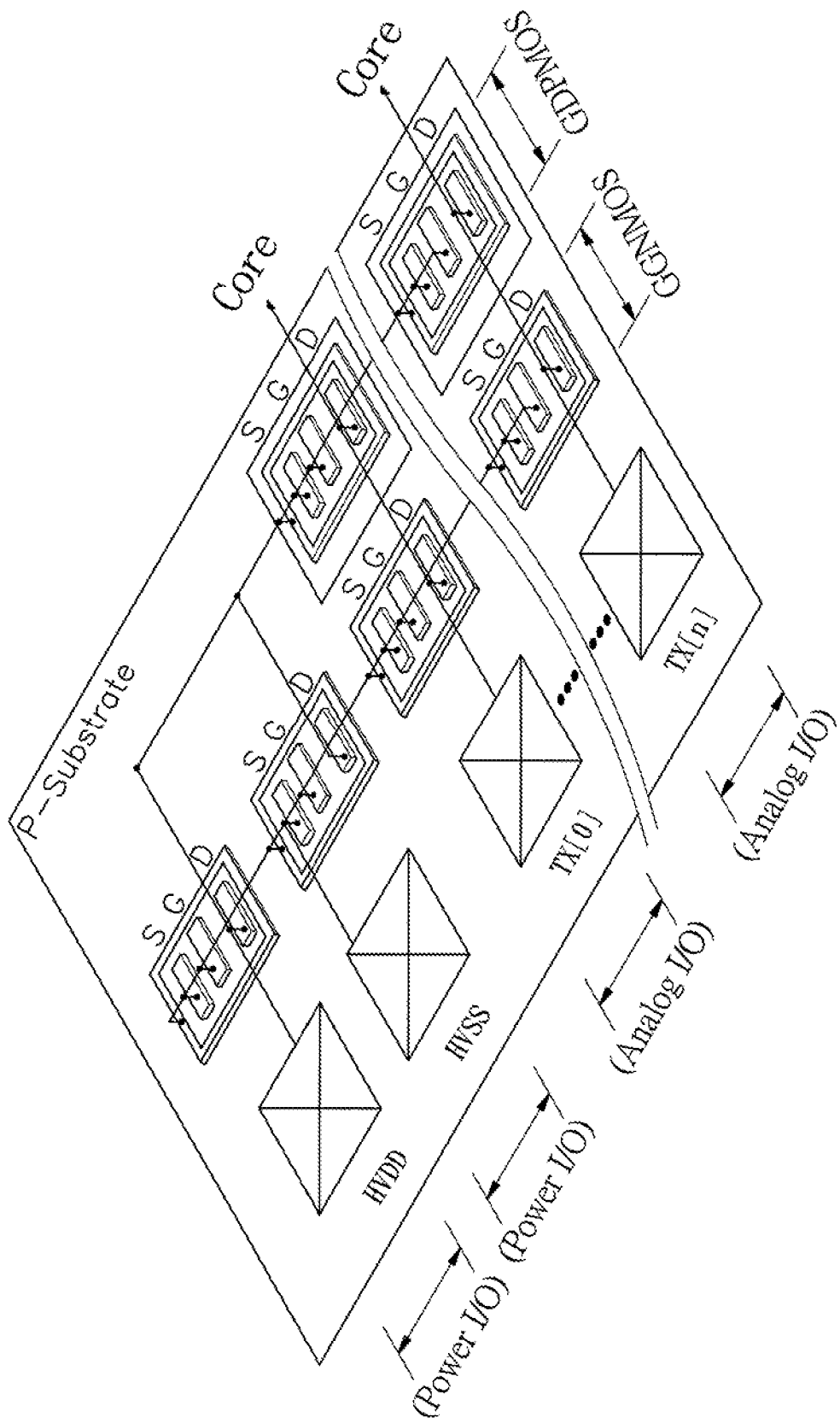
PRIOR ART FIG.6

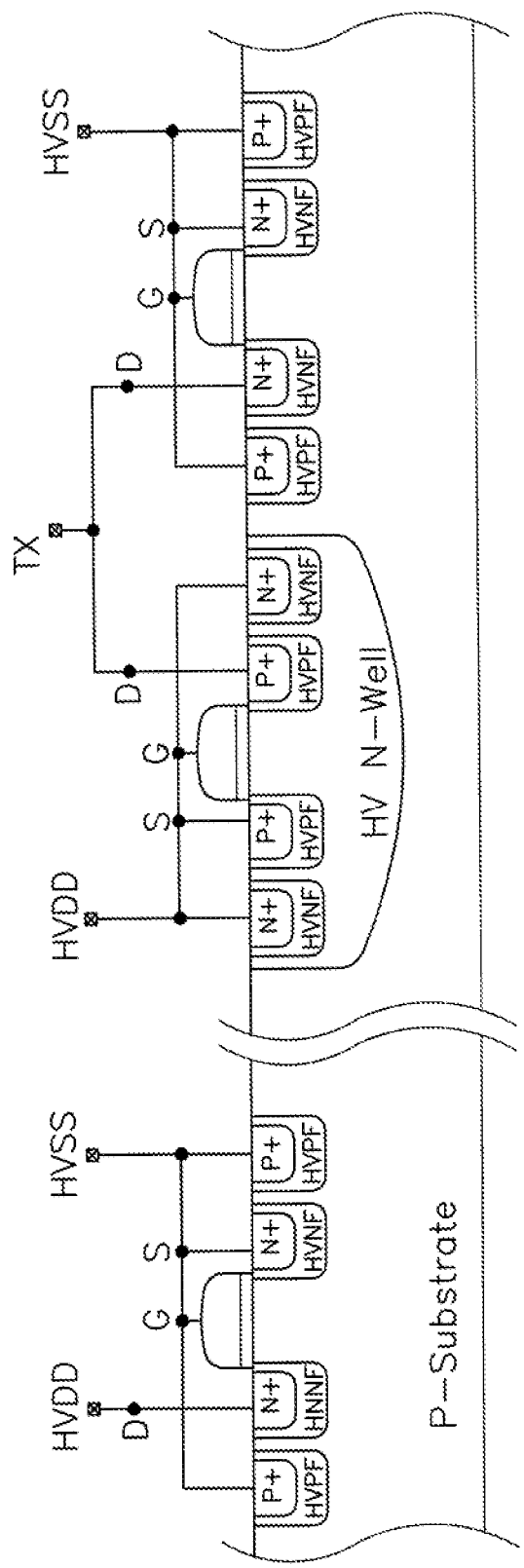
PRIOR ART FIG.7

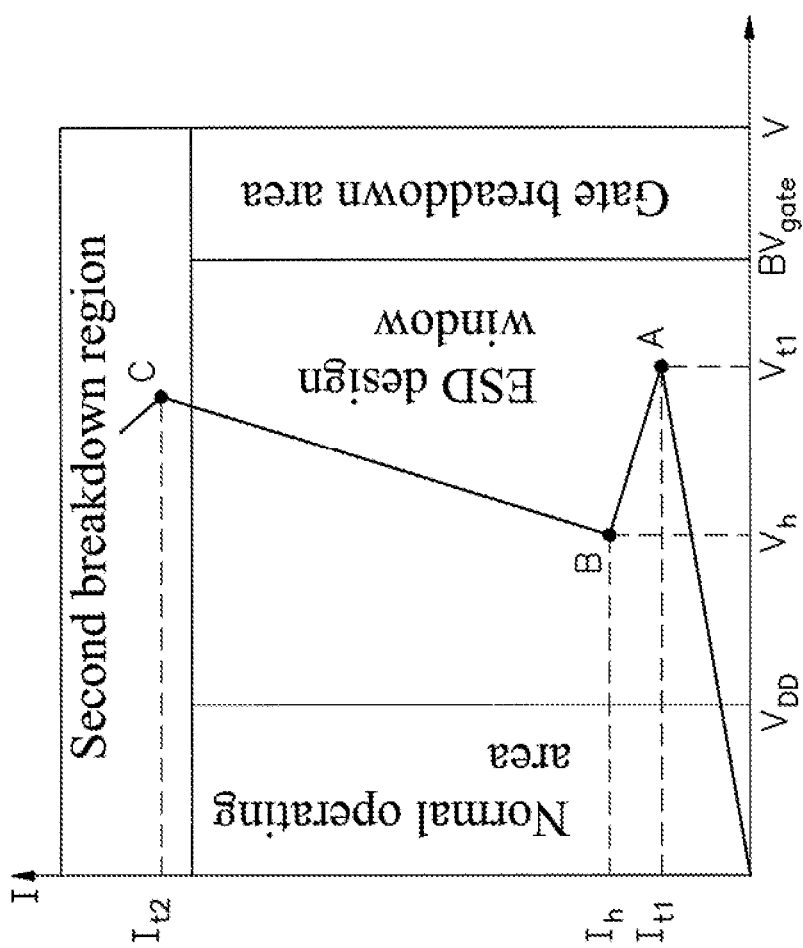
PRIOR ART FIG.8

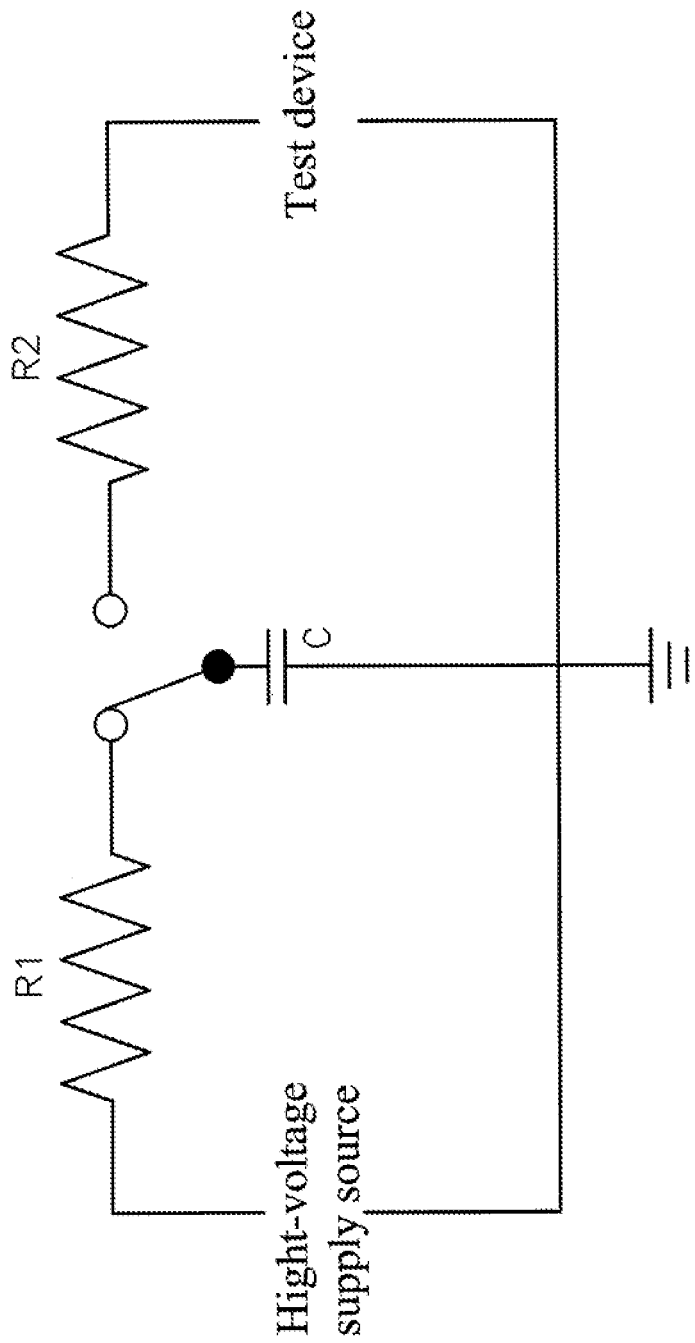
PRIOR ART FIG.9

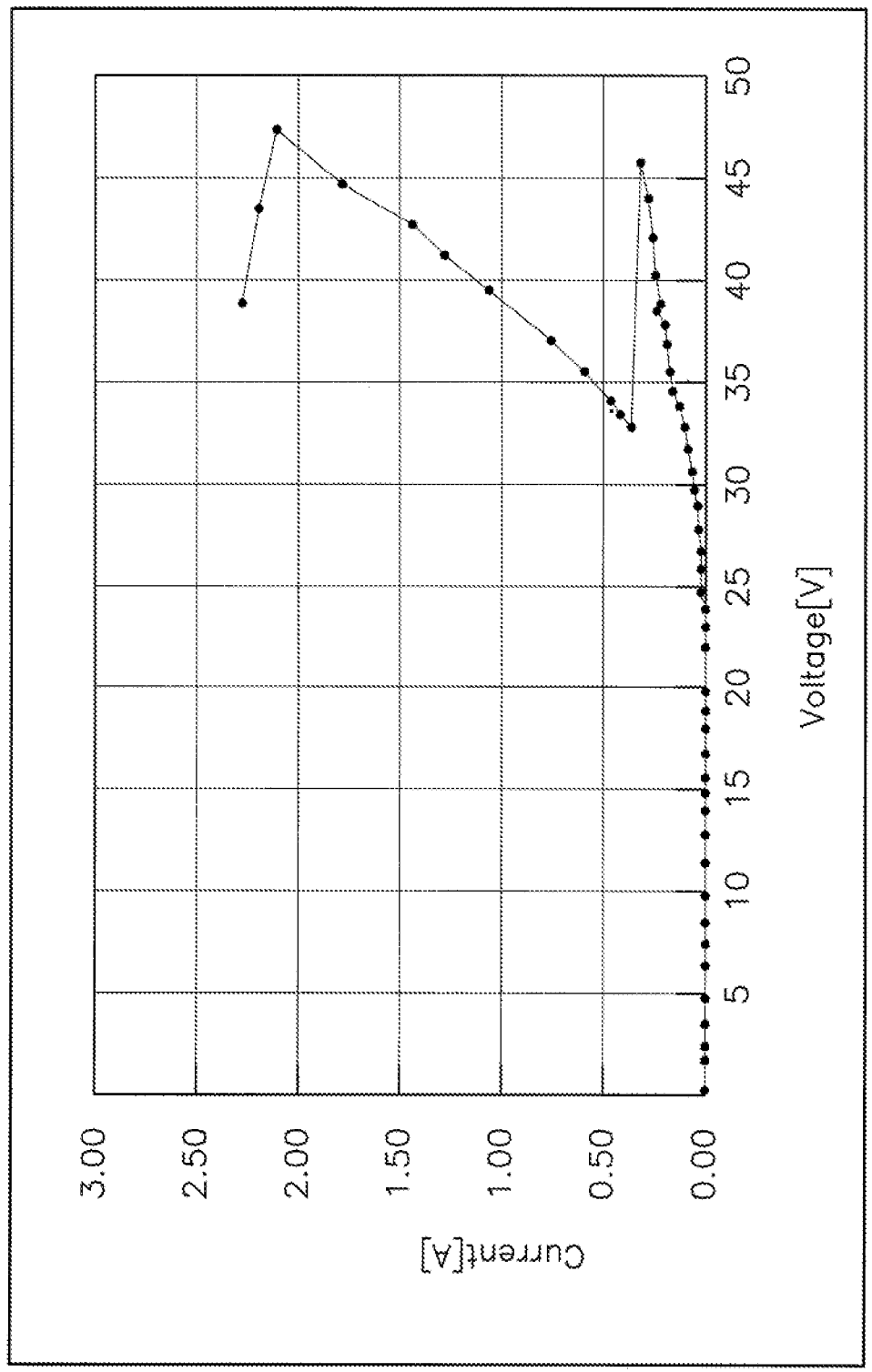
PRIOR ART FIG.10

ESD PROTECTION CIRCUIT ASSEMBLY FOR CMOS MANUFACTURING PROCESS

This application claims the priority benefit of Taiwan patent application number 106146287, filed on Dec. 28, 2017.

BACKGROUND OF THE INVENTION

1. Field of the Invention

The present invention relates to touch control technology and more particularly, to an ESD protection circuit assembly for use in a CMOS manufacturing process, in which an electrostatic discharge clamp circuit having a series of low voltage P-type structures connected thereto is electrically connected to the I/O circuit to double the withstand voltage so that a high ESD tolerance can be provided with a small circuit layout area.

2. Description of the Related Art

Today's semiconductor process technology continues to evolve and progress. The integrated circuits fabricated using CMOS technology have been designed to meet the needs of small-size and high-density. Nowadays, the CMOS manufacturing process has been changing from the original sub-micron to deep sub-micron era. As most of the integrated circuits contain MOSFET, various structural and processing requirements such as thinner gate oxide, shorter channel length, shallower source/drain junction and lower doping concentration will greatly reduce the ESD tolerance of the device itself and will be more susceptible to electrostatic discharge (ESD) damage. Therefore, an effective ESD protection design has become an important and indispensable part.

However, a conventional CMOS IC includes high voltage and low voltage components, and an ESD protection circuit capable of withstanding a high voltage must be designed at the high voltage I/O pin to enhance the electrostatic discharge tolerance.

For analog I/O, an ESD protection circuit has two purposes. The first purpose is to provide an electrostatic discharge path between HVDD and HVSS. The second purpose is to provide an electrostatic discharge path between analog I/O and HVSS. In the design architecture of a conventional ESD protection circuit as shown in FIGS. 5 and 6, high voltage PMOS and NMOS components are connected to create large size gate-grounded N-type NMOS (Gate-Grounded NMOS, GGNMOS) and gate-to-power P-type PMOS (Gate-VDD PMOS, GDPMOS), and the layout rule design pitch of the MOS manufacturing process is increased for ESD protection elements, These ESD protection elements are tested using a transmission line pulse (TLP) system to simulate what happens when an electrostatic discharge occurs.

As shown in FIG. 7, the typical ESD protection device's TLP curve yields a critical point at A (Vt1, It1) for the trigger voltage. As the ESD high-energy current pulse comes in, the voltage rises continuously (from 0 to A) and once it crosses the Vt1 critical point, the protection element forms a low-impedance path to discharge the ESD discharge energy so that the protection element's profile goes into the snapback area (from A to B), creating a holding voltage point B at (Vh, Ih). When the discharge energy of the ESD momentarily enters the protection element again, it also makes the characteristic curve of the protection element form a low impedance discharge circuit to discharge the energy (from B to C). If the voltage continues to rise, the vent current will be greater than the failure current (It2) to make the protection element unbearable, thus, it will enter the second breakdown region (the area above C) to burn the protection element.

Furthermore, the trigger voltage is used to record the instantaneous trigger point of the protection element entering the snapback region. The trigger voltage of the ESD protection element must be lower than the breakdown voltage (BV) of the internal circuit (Core) to enable the ESD element before the internal circuit has not been damaged by electrostatic bombardment. The holding voltage is the lowest voltage after the device enters the snapback state. This value must be higher than the operating voltage (VDD) of the circuit system to prevent the occurrence of the latch-up effect. The characteristic curves obtained from TLP measurements can help to design ESD protection devices with high ESD protection capability.

In general practical application, the first is to connect low-voltage PMOS and NMOS components in creating GDPMOS and GGNMOS for use as ESD protection components in low voltage environments; the second is to connect high-voltage PMOS and NMOS components in creating GDPMOS and GGNMOS for use as ESD protection components in low voltage environments. For low-voltage components used in low-voltage environments, the electrostatic discharge design window is relatively wide and safe since the breakdown voltage of low-voltage components is mostly about 2 times the operating voltage (for example, 3.3V devices have a breakdown voltage of 6.2V). However, for high-voltage components used in high-voltage environments, because of process constraints, the breakdown voltage of high voltage components are mostly only 1.1 to 1.5 times higher than the operating voltage (for example, the collapse voltage of 32V components is 45V), so ESD design window is relatively narrow.

If to protect the internal circuit not to enter the breakdown voltage region, the ESD protection components can cross into the latch region to damage or burn the components when suddenly entered the snapback breakdown; and vice versa.

As shown in Table 1 below, the sensitivity classification of the industrial test conducted by ESD is based on the Human-Body Mode (HBM) or the Machine Mode (MM) to simulate ESD events, in which, the sensitivity is usually classified according to the withstand voltage, and the MIL-STD-883 standard specification is adopted in the industrial test standard of the component level, and the electrostatic gun is directly struck on the IC components.

In the simulated human discharge mode basic circuit (as shown in FIG. 9) parameters, the charge current limiting resistor (R1) connected in series to the high voltage supply source can be 1-10 MΩ, the discharge resistance (R2) connected in series to the tested device is 1500 Ω, the storage capacitor (C) is 100 pF; in the industrial test standards of system level, IEC 61000-4-2 standard is adopted to to introduce electrical charges to the IC system components using an electrostatic gun. The defined simulated human discharge mode is similar to MIL-STD-883 standard specifications with the exception that the storage capacitor value and the discharge resistance value are different, such as the discharge resistance 50-100 MΩ, storage capacitor 150 pF, and the discharge energy and the electrostatic peak current are also very different. Non-standard test (copy the actual burnout experiment) is to electrically conduct the system product of IC components, and then to directly introduce static electricity to the system product of IC components according to IEC 61000-4-2 standard specifications. The system-level electrostatic gun energy is much higher than the component-level electrostatic gun energy.

TABLE 1

Industry standard test sensitivity classification for human discharge mode

| Classification | Sensitivity |
| --- | --- |
| Class 1 | 0 to 1,999 Volts |
| Class 2 | 2,000 to 3,999 Volts |
| Class 3 | 4,000 to 15,999 Volts |

Test Standard: MIL-STD-883

Further, the conventional electrostatic discharge protection circuit architecture described above, even though passes the component-level standard testing of ESD industrial test, but due to the high-voltage environment is complex, a considerable proportion of the actual electricity use (which can be used by system-level industry standard test to copy the actual burnout experiment) is affected by serious electrostatic impact, leading to that the ESD protection components cross into the latch region to cause damage or burnout when suddenly entered the snapback breakdown. To explore the reason, if a TLP measurement of an ESD protection element made of high-voltage PMOS and NMOS devices shown in FIGS. 5 and 6 is conducted, it will yield a characteristic curve as shown in FIG. 10. From this curve, it can be seen that the Vt1 critical point is very close to the breakdown voltage of 43V, while Vh is much lower than the operating voltage of 32V, which is the physical characteristics of high-voltage components. Therefore, although this protection component can pass the ESD industrial test standards, when the actual power is used, the ESD protection components cross into the latch region cause damage or burnout when suddenly entered the snapback breakdown due to more serious static electricity or unstable high voltage power supply. Therefore, how to design ESD protection devices with a small area and high ESD tolerance is the subject for those in the industry to study.

SUMMARY OF THE INVENTION

The present invention has been accomplished under the circumstances in view. It is therefore the main object of the present invention to provide a ESD protection circuit assembly for use in a CMOS manufacturing process, which comprises an I/O circuit including a power I/O unit and a signal I/O unit, and an electrostatic discharge clamp circuit connected to the power I/O unit. The electrostatic discharge clamp circuit comprises a P-type substrate, at least three low voltage P-type structures arranged on the P-type substrate, a plurality of low voltage N-type wells formed on the P-type substrate corresponding to the low voltage P-type structures and a first P-type heavily doped area and a second P-type heavily doped area formed in each low voltage N-type well. The first P-type heavily doped area of the first low voltage P-type structure is electrically connected to a high-voltage power termination pad through a first power line or a transmission line is electrically connected to signal transmission termination pad. The second P-type heavily doped area of the last low voltage P-type structure is electrically connected to a high-voltage ground termination pad through a second power line. Thus, the ESD protection circuit assembly provides an ESD current discharge path. Therefore, the withstand voltage can be doubled by using the series-connected low voltage P-type structures, and a high ESD tolerance can be provided with a small circuit layout area to prevent component damage caused by electrical latch.

Further, the number of the series-connected low voltage P-type structures of the electrostatic discharge clamp circuit is an unconditionally rounded up value obtained by: dividing the N times of the turn-on voltage of one individual low voltage P-type structure by the predetermined withstand voltage of the electrostatic discharge clamp circuit, in which N is an integer not greater than (i.e., equal to or smaller than) 3. When an electrostatic discharge occurs, a transient reverse pulse voltage is applied to the high-voltage power termination pad of the power I/O unit or the signal transmission termination pad of the signal I/O unit, to trigger the parasitic PNP bipolar junction transistor, thereby increasing the reverse bias between the first P-type heavily doped areas and second P-type heavily doped areas of the series of low voltage P-type structures for conduction. This provides an electrostatic discharge path, enabling the electrostatic discharge current to go from the high-voltage power termination pad or signal transmission termination pad through the four series-connected low voltage P-type structures for grounding via the high-voltage ground termination pad, preventing the electrostatic discharge current from flowing into the internal circuit and achieving the purpose of electrostatic discharge protection.

Preferably, the electrostatic discharge clamp circuit further comprises a plurality of low voltage seal rings and a plurality of high voltage seal rings. The low voltage seal rings are respectively formed in the N-type heavily doped areas of the low voltage N-type wells around the respective first P-type heavily doped areas and the second P-type heavily doped areas of the low voltage P-type structure to prevent signal interference with adjacent PMOS transistors and to reduce external component noises. Each high voltage seal ring comprises a high voltage P-type doped area formed in the P-type substrate, and a third P-type heavily doped area formed in the high voltage P-type doped area. Further, the high voltage seal ring surrounds the low voltage P-type structure to effectively isolate external component noises.

Other advantages and features of the present invention will be fully understood by reference to the following specification in conjunction with the accompanying drawings, in which like reference signs denote like components of structure

BRIEF DESCRIPTION OF THE DRAWINGS

FIG. 5 is an equivalent circuit diagram of an electrostatic discharge protection circuit according to the prior art.

FIG. 6 is an elevational view illustrating the circuit layout of the electrostatic discharge protection circuit according to the prior art.

FIG. 7 is a schematic sectional view of the electrostatic discharge protection circuit according to the prior art.

FIG. 8 is a characteristic curve of the electrostatic discharge design window according to the prior art.

FIG. 9 is a simple equivalent circuit diagram of the prior art for human body discharge mode test FIG. 10 is a voltage-current curve obtained from a test on the prior art electrostatic discharge protection circuit.

DETAILED DESCRIPTION OF THE PREFERRED EMBODIMENT

Figure 1:
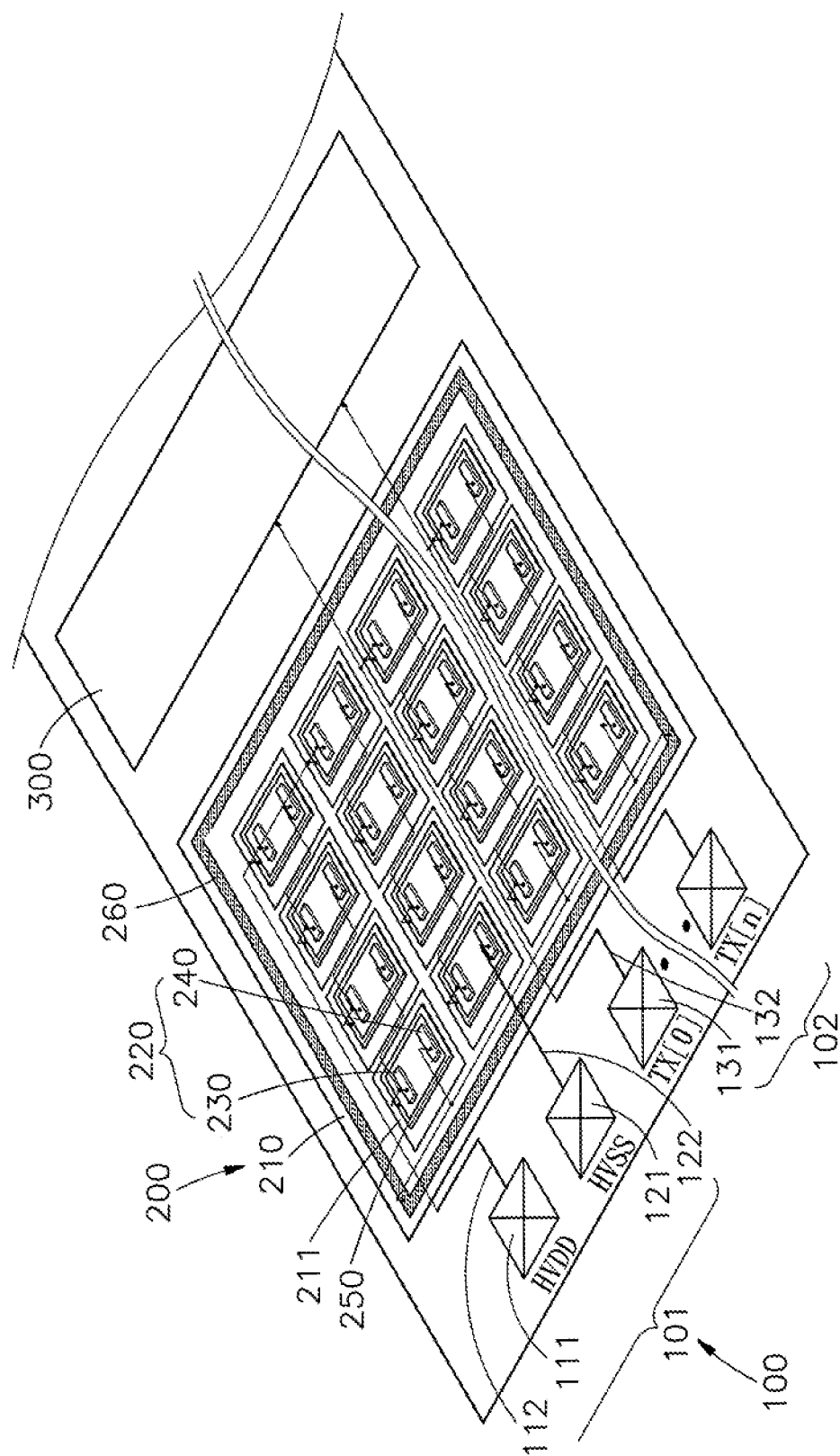
FIG. 1 illustrates the circuit layout of an electrostatic discharge protection circuit assembly in accordance with the present invention.
Figure 2:
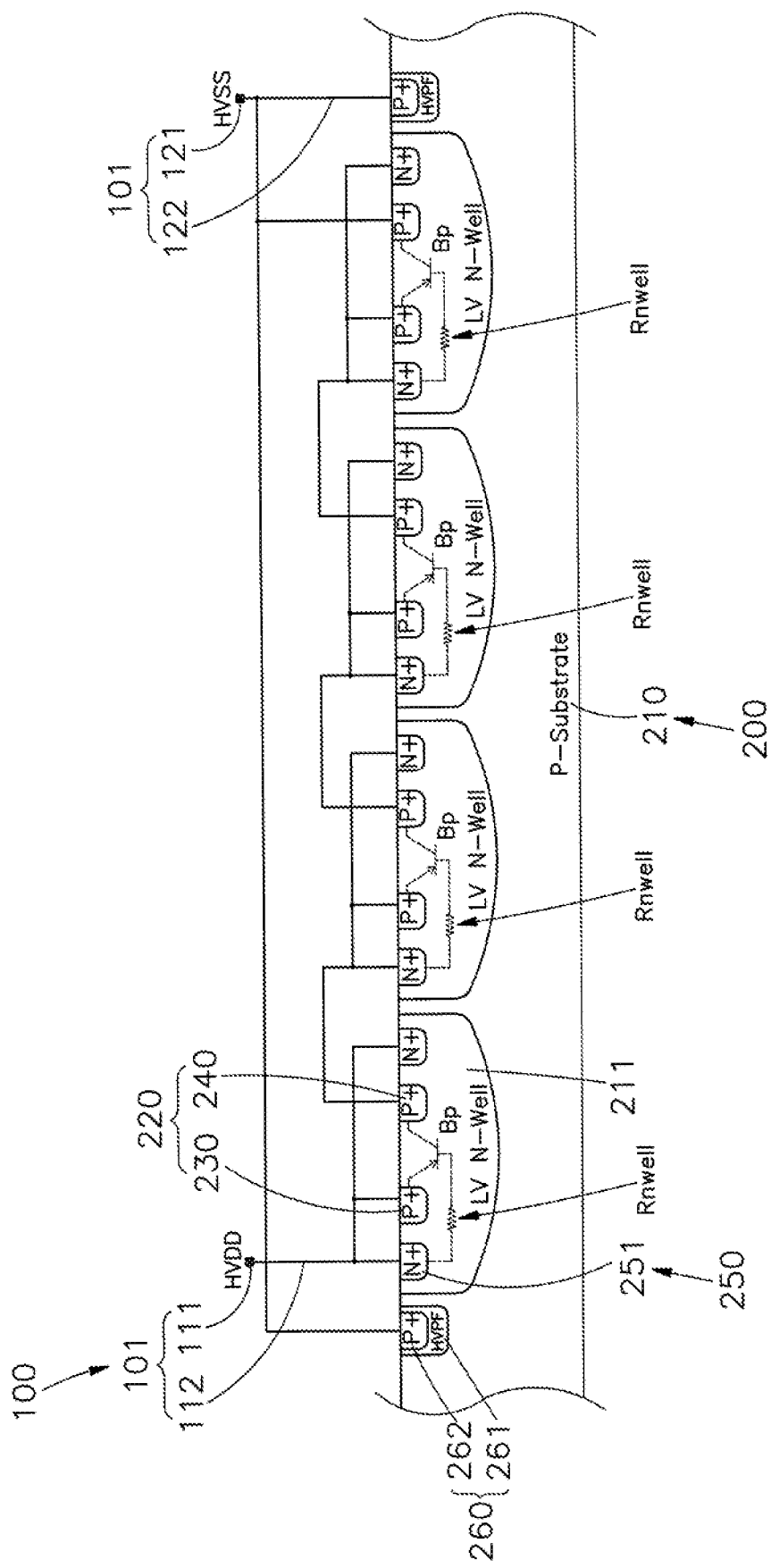
FIG. 2 is a schematic sectional view, illustrating the connection between the electrostatic discharge clamp circuit and the HVDD and HVSS of the I/O circuit.

Referring to FIGS. 1-4, an ESD (Electrostatic discharge) protection circuit assembly for use in a CMOS (Complementary Metal-Oxide-Semiconductor) manufacturing pross in accordance with the present invention is shown. The ESD (Electrostatic discharge) protection circuit assembly comprises an I/O circuit 100, an electrostatic discharge clamp circuit 200 and an internal circuit 300.

The I/O circuit 100 comprises a power I/O unit 101 and a signal I/O unit 102. The power I/O unit 101 comprises a high-voltage power termination pad 111, a first power line 112 electrically connected to the high-voltage power termination pad 111, a high-voltage ground termination pad 121, and a second power line 122 electrically connected to the high-voltage ground termination pad 121. The signal I/O unit 102 is adapted for analog signal input and output, comprising a plurality of signal transmission termination pads TX(0)~TX(N) 131, and a plurality of signal transmission lines 132 respectively electrically connected to the signal transmission termination pads TX(0)~TX(N) 131.

The electrostatic discharge clamp circuit 200 comprises a P-type substrate 210, at least three low voltage P-type structures 220 arranged on the P-type substrate 210 and connected in series, a plurality of low voltage N-type wells (LV-wells) 211 formed on the P-type substrate 210 corresponding to the low voltage P-type structures 220, and a first P-type heavily doped area (P+) 230 and a second P-type heavily doped area (P+) 240 formed in each low voltage N-type well 211. The isolation between the first P-type heavily doped area 230 and the second P-type heavily doped area 240 is selective to improve the electrical current conduction capacity of the low voltage P-type structure 220. Further, the low voltage N-type wells 211 are disposed between the first P-type heavily doped area 230 and the second P-type heavily doped area 240. Further, the doping concentration of the first P-type heavily doped area 230 and the second P-type heavily doped area 240 is higher than the doping concentration of the low voltage N-type well 211.

Further, the emitter, collector and base of a parasitic PNP bipolar junction transistor Bp are respectively formed on the first P-type heavily doped area 230 and the second P-type heavily doped area 240 of the low voltage P-type structure 220 and the low voltage N-type well 211 between the first P-type heavily doped area 230 and the second P-type heavily doped area 240. A parasitic resistance Rnwell is formed in the low voltage N-type well 211 and electrically connected to the base of the parasitic PNP bipolar junction transistor Bp.

In one embodiment of the present invention, the electrostatic discharge clamp circuit 200 further comprises a plurality of low voltage seal rings 250 and a plurality of high voltage seal rings 260. The low voltage seal rings 250 are respectively formed in N-type heavily doped areas (N+) 251 of the low voltage N-type wells 211 around the respective first P-type heavily doped areas 230 and the second P-type heavily doped areas 240 to prevent signal interference with adjacent PMOS transistors and to reduce external component noises. Each high voltage seal ring 260 comprises a high voltage P-type doped area 261 formed in the P-type substrate 210, and a third P-type heavily doped area 262 formed in the high voltage P-type doped area 261. Further, the high voltage seal ring 260 surrounds the low voltage P-type structure 220 to effectively isolate external component noises.

The internal circuit 300 is the core circuit of an IC (such as microcontroller or system-on-a-chip).

In the present preferred embodiment, the electrostatic discharge clamp circuit 200 comprises at least three low voltage P-type structures 220 arranged in an array and respectively electrically connected between HVDD and HVSS, or between TX and HVSS of the I/O circuit 100. Each low voltage P-type structure 220 is a semiconductor structure without a gate (G). In this embodiment, there are four low voltage P-type structures 220 connected in series between HVDD and HVSS, or between TX and HVSS, however, this arrangement is not a limitation. Further, the number of the series-connected low voltage P-type structures 220 may be set according to the high voltage the electrostatic discharge clamp circuit 200 is scheduled to withstand, the first P-type heavily doped area 230 and the low voltage seal ring 250 of the first low voltage P-type structure 220 are electrically connected to the high-voltage power termination pad 111 through the first power line 112 of the power I/O unit 101, and electrically connected to the first P-type heavily doped area 230 and the low voltage seal ring 250 of the second low voltage P-type structure 220 through the second P-type heavily doped area 240, and so on. Thus, the second P-type heavily doped area 240 of the preceding low voltage P-type structure 220 can be electrically connected in series to the first P-type heavily doped area 230 and the low voltage seal ring 250 that are commonly connected together by the next low-voltage p-type structure 220; the second P-type heavily doped area 240 and the high voltage seal ring 260 of the last low voltage P-type structure 220 are electrically connected with the high-voltage ground termination pad 121 through the second power line 122. Further, in one embodiment of the present invention, the first P-type heavily doped area 230 of the first low voltage P-type structure 220 and the low voltage seal ring 250 are electrically connected to the signal transmission termination pad (TX) 131 through the signal transmission line 132 of the signal I/O unit 102.

Further, each signal transmission line 132 of the signal I/O unit 102 of the I/O circuit 100 is respectively arranged between the first power line 112 and the second power line 122 of the power I/O unit 101, and electrically connected with the common node between the first P-type heavily doped area 230 and the low voltage seal ring 250 of the first low voltage P-type structure 220 to the internal circuit 300. Further, the signal I/O unit 102 can be configured to play a different role according to the design of the internal circuit 300, for example, for the connection of an external circuit for outputting a driving current or receiving an input signal. When the voltage of the electrostatic discharge occurs in the power I/O unit 101 and the signal I/O unit 102, the electrostatic discharge clamp circuit 200 provides a low impedance electrostatic discharge current discharge path, avoiding electrostatic discharge current from flowing to the internal circuit 300 to cause damage.

In the present preferred embodiment, the number of the series of the low voltage P-type structures 202 of the electrostatic discharge clamp circuit 200 is an unconditionally rounded up value obtained by: dividing the n times of the turn-on voltage of the one individual low voltage P-type structure 220 by the predetermined withstand voltage of the electrostatic discharge clamp circuit 200, in which n is an integer not greater than (i.e., equal to or smaller than) 3. For example, assume the turn-on voltage of the low voltage P-type structure 220 is 3.3V for the protection of a 32V high-voltage component, the number of the series of the low voltage P-type structures 220≥withstand voltage/(turn-on voltage×3), i.e., ≥3.23 . . . , therefore, it is necessary to connect four low voltage P-type structures 220 in series in creating the electrostatic discharge clamp circuit 200.

In normal operation (no electrostatic discharge), HVDD of the I/O circuit 100 is at high voltage, the first P-type heavily doped area 230 and the low voltage seal ring 250 of the electrostatic discharge clamp circuit 200 are equipotential, so there will be no reverse bias, that is, the low voltage P-type structure 220 connected in series by the electrostatic discharge clamp circuit 200 remains in the off state and therefore cannot be triggered, and thus, the I/O circuit 100 is in an open circuit state between HVDD and HVSS or between TX and HVSS. Therefore, the electrostatic discharge clamp circuit 200 does not affect the normal operation of the internal circuit 300.

However, when an electrostatic discharge occurs, a transient reverse pulse voltage is applied to the high-voltage power termination pad 111 of the power I/O unit 101 or the signal transmission termination pad 131 of the signal I/O unit 102, due to the existence of the low voltage N-type wells 211, the electrostatic discharge current will go from the low voltage seal rings 250 through the parasitic resistance Rnwells of the low voltage N-type wells 211 into the base of the parasitic PNP bipolar junction transistor Bp to trigger the parasitic PNP bipolar junction transistor Bp, thereby increasing the reverse bias between the first P-type heavily doped areas 230 and the second P-type heavily doped areas 240 of the series of the low voltage P-type structures 220 for conduction. This provides an electrostatic discharge path, enabling the electrostatic discharge current to go from the high-voltage power termination pad 111 or the signal transmission termination pad 131 through the four series-connected low voltage P-type structures 220 for grounding via the high-voltage ground termination pad 121, preventing the electrostatic discharge current from flowing into the internal circuit 300 and achieving the purpose of electrostatic discharge protection.

Figure 3:
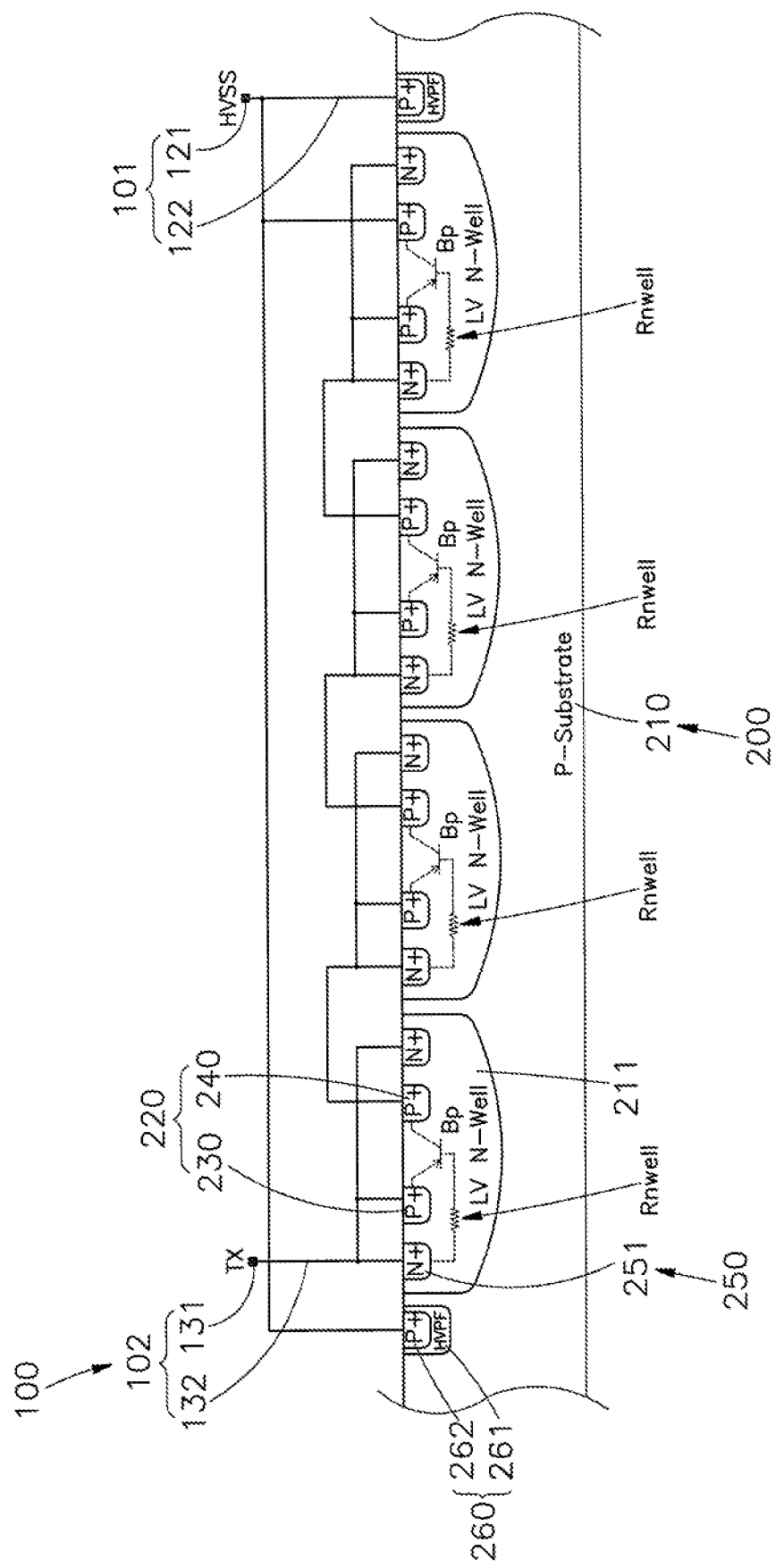
FIG. 3 is a schematic sectional view, illustrating the connection between the electrostatic discharge clamp circuit and the TX and HVSS of the I/O circuit.

As illustrated in FIG. 3, when comparing the electrostatic discharge clamp circuit 200 of the invention with the actual layout of the prior art electrostatic discharge protection circuit shown in FIG. 6, the architecture of the present invention simply uses the series-connected low voltage P-type structures 220. In the same area, the invention allows the overall layout to be properly arranged and makes more effective use of the area. In contrast, the prior art electrostatic discharge protection circuit will simultaneously use large-size PMOS and NMOS-based GDPMOS and GGNMOS, and in the production layout design specifications, the prior art design needs to maintain a sufficient distance between PMOS and NMOS, otherwise it will be more likely to cause the latch-up effect. Further, in the prior art design, the power I/O simply uses GGNMOS, it is impossible to utilize the area available for GDPMOS layout above GGNMOS. Therefore, in the present preferred embodiment, the withstand voltage can be doubled by using the series-connected low voltage P-type structures 220, and a high ESD tolerance can be provided with a small circuit layout area to prevent component damage caused by electrical latch. Further, the invention can quickly discharge electrostatic discharge current to HVSS for grounding to effectively protect the internal circuit 300 against damage and can also meet the layout design specifications to reduce the pitch and to achieve excellent area efficiency, thus reducing the overall circuit layout area and saving the costs.

Figure 4:
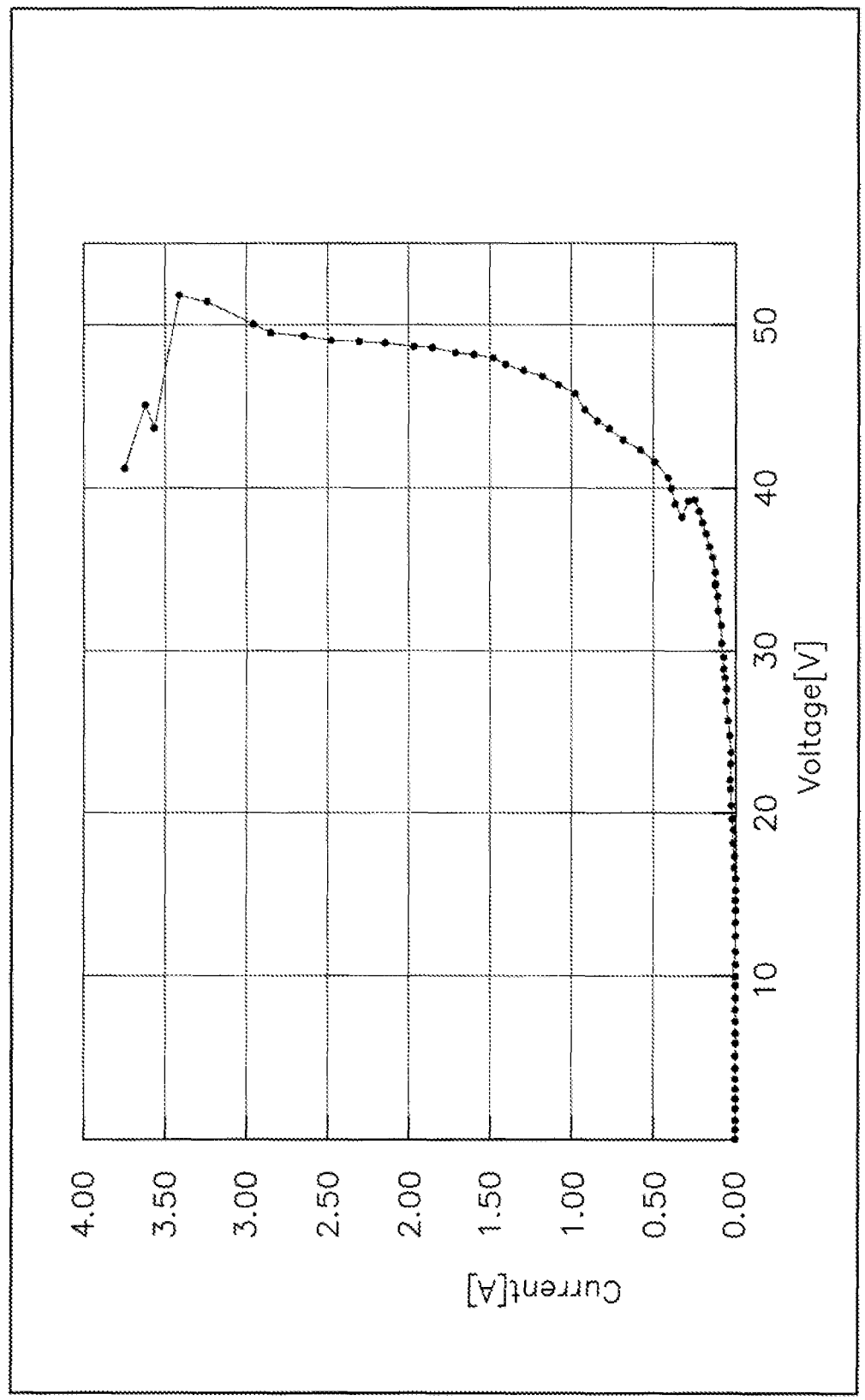
FIG. 4 is a voltage-current curve obtained from a test made on the electrostatic discharge protection circuit assembly in accordance with the present invention.

FIG. 4 is a voltage-current curve obtained from an electrostatic discharge simulation test by using a transmission line pulse generation system to generate a pulse voltage under the same layout area. From the test result, we can see, in the design of the present invention, the trigger voltage/current to be (Vt1,It1)=(39.35, 0.27) and holding voltage to be (Vh,Ih)=(39.16, 0.32), and in the design of the prior art (see FIG. 9), the trigger voltage/current to be (Vt1,It1)= (45.66, 0.22) and the holding voltage to be (Vh,Ih)=(32.26, 0.26), therefore, the trigger voltage of the invention is lower than that of the prior art design, i.e., the electrostatic discharge clamp circuit 200 can be quickly activated before the internal circuit 300 is bombarded by the electrostatic discharge, and the holding voltage can be significantly increased to effectively prevent the occurrence of a latch-up effect and to provide excellent electrostatic discharge protection.

As shown in Table 2 below, a comparison test result under human body discharge mode with the use of a transmission line pulse generation system (LTP) and made on the architecture of the present inventive and the prior art architecture is shown.

TABLE 2

ESD test results on the invention and the prior art architecture.

| | | | Prior art | The invention |
|---|---|---|---|---|
| Component level standard test | MIL-STD-883 | Analog I/O | ±3500 v Pass | ±4000 v Pass |
| | | Power I/O | ±5500 v Pass | ±6000 v Pass |
| Non-standardized test | IEC 61000-4-2 | Analog I/O | ±1000 v Pass | ±4500 v Pass |
| | | Power I/O | ±1500 v Pass | ±8000 v Pass |
| | TLP measurement | Vt1 | 45.66 v | 39.35 v |
| | | Vh | 32.26 v | 39.16 v |

From the above test results, we can seed that the performance of the architecture of the present invention in ESD protection circuit activated Vt1 in TLP measurement is better than the prior art architecture. Both the invention and the prior art design can pass Class 2 2000V~3999V test under the component level, however, in TLP measurement, the holding voltage (39.16V) of the architecture of the present invention is higher than the holding voltage (32.26V) of the prior art architecture. In a human body discharge mode test by using an electrostatic gun of an electrostatic discharge test system to introduce an electric charge to an IC component of a system product, the architecture of the present invention is significantly superior to the prior art architecture in electrostatic protection. Therefore, the architecture of the preferred embodiment of the present invention does improve the performance and can ensure the resistance of IC components to the electrostatic discharge and power supply variation in the real environment in practical application.

Although a particular embodiment of the invention has been described in detail for purposes of illustration, various modifications and enhancements may be made without departing from the spirit and scope of the invention. Accordingly, the invention is not to be limited except as by the appended claims.

What the invention claimed is:

1. An ESD protection circuit assembly comprising:
   an I/O circuit comprising a power I/O unit, said power I/O unit comprising a high-voltage power termination pad, a first power line electrically connected to said high-voltage power termination pad, a high-voltage ground termination pad and a second power line electrically connected to said high-voltage ground termination pad; and
   an electrostatic discharge clamp circuit comprising a P-type substrate, at least three low voltage P-type structures arranged on said P-type substrate and connected in series, a plurality of low voltage N-type wells formed on a top side of said P-type substrate and said at least three low voltage P-type structures each comprising a first P-type heavily doped area and a second P-type heavily doped area formed in a corresponding one of said low voltage N-type wells, respectively, said first P-type heavily doped area and said second P-type heavily doped area being separated from each other through a part of the corresponding one of said low voltage N-type wells, the said first P-type heavily doped area of the first said low voltage P-type structure being electrically connected to said high-voltage power termination pad through said first power line, wherein the said second P-type heavily doped area of the preceding said low voltage P-type structure is electrically connected in series to the said first P-type heavily doped area of the next said low voltage P-type structure, the said second P-type heavily doped area of the last said low voltage P-type structure being electrically connected to said high-voltage ground termination pad through said second power line to provide an ESD current discharge path;
   wherein said electrostatic discharge clamp circuit further comprises a plurality of low voltage seal rings; said low voltage seal rings are formed in respective N-type heavily doped areas of said low voltage N-type wells around the respective said first P-type heavily doped areas and said second P-type heavily doped areas; and said low voltage rings are electrically connected to the respective said first P-type heavily doped areas in the respective said low voltage N-type wells; and
   wherein said electrostatic discharge clamp circuit further comprises a high voltage seal ring surrounding said at least three low voltage P-type structures; said high voltage seal ring is formed of a high voltage P-type doped area in said P-type substrate; and said second P-type heavily doped area of the last said low voltage P-type structure and said high voltage seal rings are electrically connected to said high-voltage ground termination pad through said second power line.

2. The ESD protection circuit assembly as claimed in claim 1, wherein an emitter, a collector and base of a parasitic PNP bipolar junction transistor are respectively formed on the said first P-type heavily doped area and said second P-type heavily doped area of each said low voltage P-type structure and said low voltage N-type well between the said first P-type heavily doped area and the said second P-type heavily doped area; a parasitic resistance is formed in said low voltage N-type well and electrically connected to the base of said parasitic PNP bipolar junction transistor.

3. An ESD protection circuit assembly, comprising:
   an IO circuit comprising a power IO unit and a signal IO unit, said power IO unit comprising a high-voltage ground termination pad and a second power line electrically connected to said high-voltage ground termination pad, said signal IO unit comprising at least one signal transmission termination pad and a plurality of signal transmission lines respectively electrically connected to said at least one signal transmission termination pad; and
   an electrostatic discharge clamp circuit comprising a P-type substrate, at least three low voltage P-type structures arranged on the P-type substrate and connected in series, a plurality of low voltage N-type wells formed on a top side of said P-type substrate and said at least three low voltage P-type structures each comprising a first P-type heavily doped area and a second P-type heavily doped area formed in a corresponding one of said low voltage N-type wells, respectively, said first P-type heavily doped area and said second P-type heavily doped area being separated from each other through a part of the corresponding one of said low voltage N-type wells, said first P-type heavily doped area of the first said low voltage P-type structure being electrically connected to said at least one signal transmission termination pad through at least one of said signal transmission lines, wherein the said second P-type heavily doped area of the preceding said low voltage P-type structure is electrically connected in series to the said first P-type heavily doped area of the next said low voltage P-type structure, said second P-type heavily doped area of the last said low voltage P-type structure being electrically connected to said high-voltage ground termination pad through said second power line to provide an ESD current discharge path;
   wherein said electrostatic discharge clamp circuit further comprises a plurality of low voltage seal rings; said low voltage seal rings are formed in respective N-type heavily doped areas of said low voltage N-type wells around the respective said first P-type heavily doped areas and said second P-type heavily doped areas; and said low voltage rings are electrically connected to the respective said first P-type heavily doped areas in the respective said low voltage N-type wells; and
   wherein said electrostatic discharge clamp circuit further comprises a high voltage seal ring surrounding said at least three low voltage P-type structures; said high voltage seal ring is formed of a high voltage P-type doped area in said P-type substrate; and said second P-type heavily doped area of the last said low voltage P-type structure and said high voltage seal rings are electrically connected to said high-voltage ground termination pad through said second power line.

4. The ESD protection circuit assembly as claimed in claim 3, wherein an emitter, a collector and base of a parasitic PNP bipolar junction transistor are respectively formed on said first P-type heavily doped area and said second P-type heavily doped area of each said low voltage P-type structure and said low voltage N-type well between said first P-type heavily doped area and said second P-type heavily doped area; a parasitic resistance is formed in said low voltage N-type well and electrically connected to the base of said parasitic PNP bipolar junction transistor.

* * * * *